FIRST ENCODING STAGE FOR A STAGE BY STAGE ENCODER
Filed Dec. 1, 1966
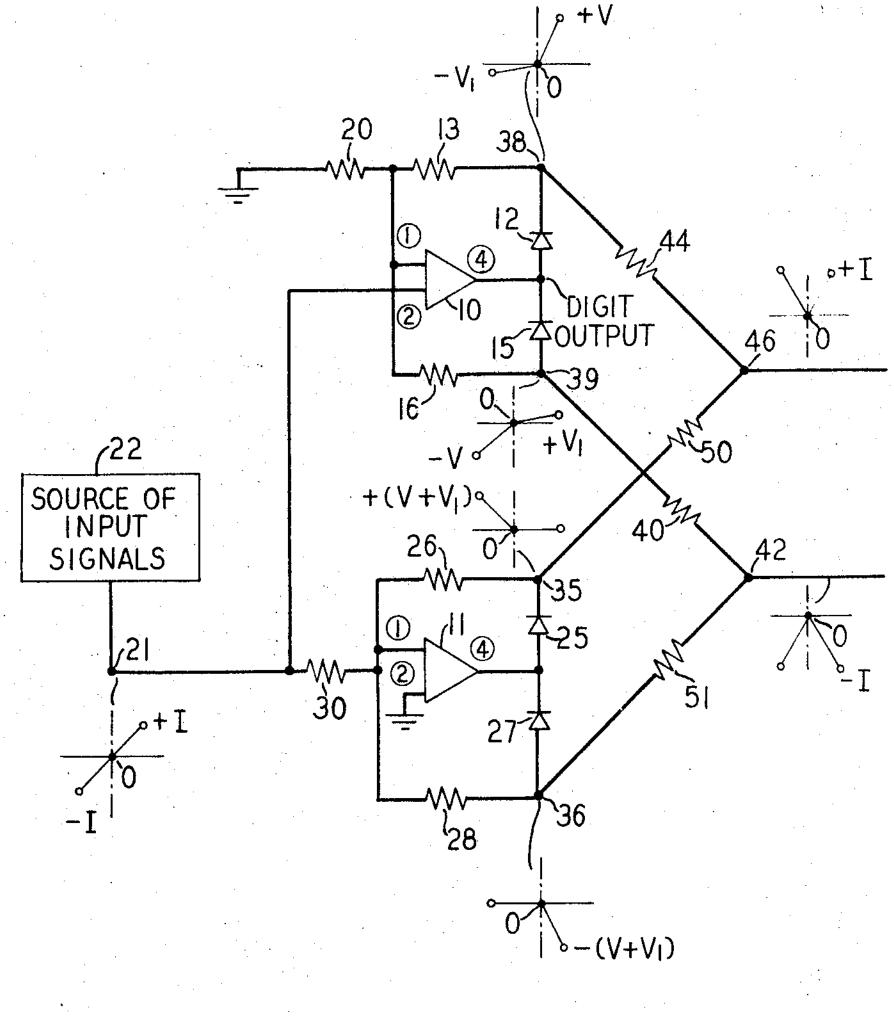
INVENTOR
V. R. SAARI
BY Leonard R. Arnold
ATTORNEY United States Patent Office 3,521,273
Patented July 21, 1970

3,521,273

FIRST ENCODING STAGE FOR A STAGE BY STAGE ENCODER

Veikko R. Saari, Old Bridge, N.J., assignor to Bell Telephone Laboratories, Incorporated, Murray Hill, N.J., a corporation of New York Filed Dec. 1, 1966, Ser. No. 598,318
Int. Cl. G08c *5/00, 9/00, 11/00*
U.S. Cl. 340—347 4 Claims

ABSTRACT OF THE DISCLOSURE

A first encoding stage for a stage by stage encoder using a noninverting operational amplifier and an inverting operational amplifier each directly connected to receive the signal to be encoded. Each amplifier has two feedback circuits with each such feedback circuit employing a resistor and a nonlinear device. The devices are poled in opposite directions with respect to one another and the junction of the first such device and its associated feedback resistor is connected to a first analog output terminal and the junction of the second such device and its associated resistor is connected to a second analog output terminal. As a result, V-shaped and inverted V-shaped output signals currents are produced at the output terminals in response to one complete traversal of the input current range. In addition, a digital output signal is produced at the output of one amplifier.

This invention relates to stage by stage encoders and provides a first stage for such encoders which can perform the same operations as the more conventional and previously used combination of an encoding stage and an inverting amplifier. An encoding stage according to the invention includes a noninverting operational amplifier and an inverting operational amplifier each of which has two feedback circuits with each feedback circuit comprising the series connection of a resistor and a nonlinear impedance. The input signal to be encoded is directly connected to the inputs of the operational amplifiers whose outputs are interconnected so as to create a composite output current function which is proportional to the absolute value of the input signal. The inverse of that composite function is also available.

U.S. Pat. 2,632,058 which issued to F. Gray on Mar. 17, 1953, describes a coding technique that offers certain distinct advantages over conventional binary coding. These advantages follow from the particular characteristic of the Gray code there described, that no two successive encoded numbers differ by more than a single digit. The Gray code is also called the reflected-binary code, due to the manner in which the code is formed.

One technique for forming reflected binary code groups from analog signals is particularly advantageous and has been embodied in the "stage by stage" encoder. U.S. Pat. 3,035,258, which issued to N. E. Chasek on May 15, 1962, describes such an encoder having many tandem encoding stages (one for each digit in the code word). Each of these stages has an analog input, analog output, and digit output. The analog output of the first stage is the analog input of the next, and so on. The stages exhibit a V-shaped transfer characteristic between the analog input and analog output. Conventional full wave bridge rectifiers in each stage yield this transfer characteristic and digit output means responsive to the conductivity state of one of the rectifier diodes determine the polarity of the input signal to each stage.

Improved stage-by-stage encoding circuitry is described in U.S. Pat. 3,187,325 which issued to F. D. Waldhauer on June 1, 1965. As contemplated therein the desired V-shaped, or full-wave rectifier transfer characteristic is developed on a piecewise basis, that is, the two legs of the V are generated seperately by an encoding network and subsequently combined. Each half of the desired characteristic is generated by means of an amplifier that has a feedback path comprising the serially connected combination of a nonlinear impedance element and a resistor. A linear analog output is obtained from the junction of the nonlinear element and the resistor, and the binary, or digit ouput, is obtained from the output of the amplifier. Each amplifier has a pair of feedback paths, each of which develops one-half the required transfer characteristic so that the resulting stage functions as a binary stage of a stage by stage encoder.

In a preferred form of the stage by stage encoder described in the above mentioned Waldhauer patent a balanced encoding system is employed to increase coding speed. Each stage of such a balanced encoder is made up of two networks, each of the type discussed above. These networks operate in phase opposition, that is, when the output of one amplifier is positive, the output of the complementary amplifier in the same stage is negative. As described in the Waldhauer patent the first stage must be driven in phase opposition by balanced input signals. Heretofore such balanced input signals have been obtained either by the use of an inverter amplifier connected between the input signal to be encoded and one half of the first stage or by the use of a special polarity extractor circuit which described in the Waldhauer patent. The use of an inverter amplifier not only increases the cost of the first stage but reduces coding speed somewhat and, in addition, presents the problem of having different propagating speeds in the two paths of the first stage. The polarity extractor first stage circuit does not have such speed limitations but is limited to applications requiring relatively low output power to the second stage of the coder.

It is an object of this invention therefore to increase the coding speed of a stage by stage coder without reducing the power applied to the second stage.

In accordance with this invention a noninverting operational amplifier and an inverting operational amplifier are directly connected to receive the signal to be encoded. Each amplifier has two feedback circuits with each such feedback circuit comprising the series connection of a resistor and a nonlinear impedance. The feedback circuits of each amplifier have their nonlinear devices poled in opposite directions with respect to each other so that a first device conducts and the second is back biased when the input signal is of positive polarity, and the reverse conduction conditions exist when the input signal is of negative polarity. The junction of the first such diode and its associated feedback resistor in each amplifier circuit is connected to a first output terminal by means of a resistor, and the junction of the second such diode and its associated resistor in each amplifier is connected to a second output terminal by means of a resistor. The two amplifiers operate with a 180-degree phase difference in output voltage at the point where the corresponding diode pairs are joined and as a result of the interconnection of the output signals as described above V-shaped and inverted V-shaped output signal currents as well as a digital output signal are produced in response to one complete traversal of the input current range. These signals are the signals which must be produced by the first stage of a stage by stage encoder, and are produced without the necessity of an inverting amplifier preceding either amplifier. In addition, the power output level is higher than that produced by the polarity extractor stage discussed above.

This invention will be more fully comprehended from the following detailed description taken in conjunction with the accompanying figure which is a schematic diagram of a first stage for a stage by stage encoder embodying the invention.

The encoding network shown in the accompanying figure employs two operational amplifier circuits. Because there is no standardization of symbology regarding operational amplifier circuits, it should be noted that the symbols employed in the figure are those employed by Burr-Brown Research Corporation as described in their Handbook of Operational Amplifier Applications, first edition, copyright 1963, in Figure 2*b* on page 2. In this symbology input terminal 1 in each operational amplifier 10 and 11 is the inverting input or summing point which means that a positive current flowing into terminal 1 of amplifiers 10 and 11 through resistor 30 or resistor 20 respectively produces a negative voltage at output terminal 4. Similarly, a negative input current at terminal 2, which is designated the differential input terminal, produces a negative voltage at output terminal 4.

Operational amplifier 10 has two feedback circuits. The first comprises diode 12 and resistor 13 connected in a series connection between output terminal 4 and input terminal 1. The second feedback circuit comprises the series connection of a diode 15 and a resistor 16 connected between output terminal 4 and input terminal 1. Diode 12 is poled to conduct when the voltage at output terminal 4 of amplifier 10 is positive, and diode 15 is poled to conduct when that voltage is negative. In addition, input terminal 1 is connected to ground through resistor 20 while input terminal 2 is connected to directly receive the input signal to be encoded which is applied to input terminal 21 from source 22. The resulting configuration of amplifier 10 and its feedback circuits is that of the noninverting operational amplifier shown in Figure 11B of the above-mentioned handbook so that the output voltage appearing at terminal 38 or 39 of amplifier 10 is equal to $$\frac{R_f+R_{20}}{R_{20}}E_{\text{input}} \qquad (1)$$

where $R_f$ is the resistance of resistor 13 or resistor 16 and $R_{20}$ is the resistance of resistor 20. The increment of output voltage appears at terminal 38 or 39 depending upon which of the two feedback circuits is in operation.

Operational amplifier 11 also has two feedback circuits each comprising the series connection of a resistor and a diode. A first of the feedback circuits comprises the series connection of diode 25 and resistor 26 connected between output terminal 4 of amplified 11 and input terminal 1. The second feedback circuit comprises the series connection of diode 27 and resistor 28 also connected between output terminal 4 and input terminal 1. Diodes 25 and 27 are poled oppositely with respect to one another so that one or the other conducts depending upon the polarity of the output voltage. In addition, input terminal 2 is grounded and input terminal 1 is connected by means of resistor 30 to circuit input terminal 21. The resulting configuration is that of the basic inverting operational amplifier shown in FIG. 11A on page 7 of the above reference where the output voltage at terminal 35 or 36 is equal to $$-\frac{R_f'}{R_{30}}E_{\text{input}} \qquad (2)$$

where $R'_f$ is the resistance of resistor 26 or 28, depending upon which of the two feedback circuits is in operation, and $R_{30}$ is the resistance of resistor 30.

For convenience the output voltages and currents generated by the circuit are shown (as functions of the input currents and voltages respectively) at the various output terminals shown in the figure. To simplify an understanding of these waveforms, a dashed vertical line has been drawn through the input current wave form at zero units of current and two dots are used to denote two values of the input current. The positive value, +I, of input current is indicated by a dot to the right of the vertical line and the negative value —I, by a dot to the left of the vertical line. A vertical line is also shown passing through each of the output signal waveforms. This line is to be understood to indicate the value of the output voltage or current (as indicated) when the input current is at zero units. The dot to the right of the vertical line in an output waveform is the voltage or current as indicated when the input current is at +I units of current and the dot to the left of the vertical line in an output waveform indicates the voltage or current, as indicated, when the input current is at —I units of current.

The operational amplifier 11 and its associated feedback networks operate to product two output characteristics at terminals 35 and 36 which characteristics are shown in the accompanying figure. The amplifier 11 includes one net phase reversal since it is an inverting amplifier so that when the input current is positive (flowing toward input terminal 1), the output voltage of amplifier 11 is negative and diode 25 is back biased. In this condition, virtually no current flows through resistor 26 and as shown the voltage at terminal 35 is zero. When the input current is negative however, the output voltage of amplifier 11 is positive, diode 25 becomes forward biased, and a positive voltage appears at output terminal 35. Diode 27 will be back biased for negative input currents and, due to amplifier 11's high current gain, negligible current flows into amplifier 11 at terminal 1 so that essentially all the current flows through resistor 26. As shown, therefore, as the magnitude of the negative input current increases the magnitude of the voltage at terminal 35 rises in a linear manner. The relationship between the voltage at terminal 36 and the input current is explainable by a similar process and is shown in the accompanying figure.

Since the amplifier 10 is connected in the non-inverting configuration its operation is somewhat different from that of amplifier 11. When the input current applied to terminal 21 is positive, the voltage output of amplifier 10 is positive because there is no phase inversion. Diode 12 is forward biased and as a result the voltage at terminal 38 rises in a linear fashion for increasing values of positive input current. At the same time diode 15 is back biased but the voltage at its anode and terminal 39 also rises slightly due to the face that the voltage developed across the voltage divider comprising resistors 16 and 40, which connects terminal 39 to output terminal 42, is also rising. Conversely, when the input current is negative, diode 12 is cut off so that the voltage at terminal 38 drops slightly in response to increasing negative values of voltage developed across resistors 13 and 44, the latter connecting terminal 38 to output terminal 46. At the same time the voltage at the anode of diode 15 increases in a linear fashion in a negative direction. The output characteristics generated by operational amplifier 10 are shown in the accompanying figure. The output signals at terminal 35 are applied to output terminal 46 through resistor 50 and the output signals at terminals 36 are applied to output terminal 42 by means of resistor 51.

The result of the addition of the output signals at terminals 38 and 35 is such that the transfer characteristic at terminal 46 is V-shaped, and the result of the addition of the output signals at terminals 36 and 39 at terminal 42 is an inverted V-shaped transfer characteristic. These static characteristics are identical to those which are obtained from the first stage of a conventional stage by stage encoder employing either a polarity extractor circuit such as shown in the above mentioned Waldhauer patent or employing an inverting amplifier between the input terminal and one of the amplifiers in the first stage of a balanced type encoder. A stage by stage encoder embodying this invention is therefore capable of higher coding speeds than a coder employing an inverting amplifier and in addition is capable of producing higher output signal power than the polarity extractor circuit disclosed in the Waldhauer reference.

It is to be understood that the above described arrangements are merely illustrative of the principles of the invention. Numerous other arrangements may be devised by those skilled in the art without departing from the spirit and scope of the invention.

What is claimed is:

1. A binary encoding stage for a stage by stage encoder comprising, in combination, an analog input, two analog outputs, and a digit output terminal, an inverting operational amplifier having an input, an output, and two feedback paths, a noninverting operational amplifier having an input, an output, and two feedback paths, means connecting said analog input to said inputs of said amplifiers, and means connecting said feedback paths of said amplifiers to said analog output terminals to obtain a V-shaped transfer conductance characteristic between one of said analog output terminals and said analog input terminal and an inverted V-shaped transfer conductance characteristic between the second of said analog output terminals and said analog input terminal, and means connecting at least one of said amplifier output terminals to said digit output terminal.

2. A binary encoding stage for a stage by stage encoder comprising, in combination, an analog input terminal, two analog output terminals, and a digit output terminal, a noninverting operational amplifier circuit having an input, an output, and two feedback paths each comprising the series connection of a resistor and a nonlinear device, an inverting operational amplifier circuit having an input, an output, and two feedback paths each comprising the series connection of a resistor and a nonlinear device, means connecting said analog input terminal to said inputs of said amplifiers, means connecting the junction of the resistor and the nonlinear device in a first of said feedback paths of each of said amplifiers to a first of said analog output terminals, and means connecting the junction of the resistor and the nonlinear device in a second of said feedback paths of each of said amplifiers to a second of said analog output terminals, and means connecting at least one of said amplifier output terminals to said digit output terminal.

3. A binary encoding stage for a stage by stage encoder comprising, in combination, an analog input terminal, two analog output terminals, and a digit output terminal, a noninverting operational amplifier circuit having an input, an output, and two feedback paths each comprising the series connection of a resistor and a nonlinear device, said nonlinear devices being poled in opposite directions with respect to each other, an inverting operational amplifier circuit having an input, an output, and two feedback paths each comprising the series connection of a resistor and a nonlinear device, said nonlinear devices being poled in opposite directions with respect to each other, means connecting the junction of said resistor and said nonlinear device in a first feedback path of said noninverting amplifier to a first of said analog output terminals, means connecting the junction of said resistor and said nonlinear device in a first feedback path of said inverting operational amplifier whose nonlinear device is nonconductive at the same time that said diode in said first feedback path of said noninverting amplifier conducts to said first analog output terminal, and means connecting the junctions of said devices and said resistors in the second feedback path of each operational amplifier circuit to the second analog output terminal, and means connecting at least one of said amplifier output terminals to said digit output terminal.

4. A binary encoding stage for a stage by stage encoder comprising, in combination, an analog input terminal, two analog output terminals, and a digit output terminal, a noninverting operational amplifier circuit having an input, an output and two feedback paths each comprising the series connection of a resistor and a diode with the anode of the diode in a first of said feedback paths and the cathode in the second of said feedback paths connected to said noninverting operational amplifier output, an inverting operational amplifier circuit having an input, an output, and two feedback paths each comprising the series connection of a resistor and a diode with the anode of the diode in a first of said feedback paths and the cathode of the diode in the second of said feedback paths connected to said output of said inverting amplifier, means connecting said analog input terminal to said inputs of said amplifiers, means connecting the junctions of said diodes and resistors in said first feedback paths of said amplifiers to a first of said analog output terminals, and means connecting the junctions of said diodes and said resistors in said second feedback paths of said amplifiers to said second analog output terminal so that a V-shaped transfer characteristic between said analog input and first analog output terminal is obtained and an inverted V-shaped transfer characteristic between said analog input and said second analog output terminal is obtained, and means connecting at least one of said amplifier output terminals to said digit output terminal.

References Cited

UNITED STATES PATENTS

| | | | |
|---|---|---|---|
| 3,035,258 | 5/1962 | Chasek | 340—347 |
| 3,076,901 | 5/1963 | Rubin et al. | 307—229 |
| 3,130,325 | 4/1964 | Rubin et al. | 307—229 |
| 3,145,377 | 8/1964 | Saal | 340—347 |
| 3,187,325 | 6/1965 | Waldhauer | 340—347 |
| 3,311,835 | 3/1967 | Richman | 307—229 X |

MAYNARD R. WILBUR, Primary Examiner

S. R. EDWARDS, Assistant Examiner

U.S. Cl. X.R.

307—229